United States Patent
Tanaka et al.

(10) Patent No.: US 9,860,981 B2
(45) Date of Patent: *Jan. 2, 2018

(54) TRANSPARENT CONDUCTIVE FILM AND METHOD FOR PRODUCING SAME

(75) Inventors: Takuro Tanaka, Chiba (JP); Yasuhiko Nakagawa, Chiba (JP); Hiroyuki Iizuka, Chiba (JP); Koji Ohguma, Chiba (JP); Mikio Yamahiro, Chiba (JP)

(73) Assignee: JNC CORPORATION, Tokyo (JP)

(*) Notice: Subject to any disclaimer, the term of this patent is extended or adjusted under 35 U.S.C. 154(b) by 130 days.

This patent is subject to a terminal disclaimer.

(21) Appl. No.: 13/808,911

(22) PCT Filed: Jul. 5, 2011

(86) PCT No.: PCT/JP2011/065406
§ 371 (c)(1),
(2), (4) Date: Jan. 8, 2013

(87) PCT Pub. No.: WO2012/005271
PCT Pub. Date: Jan. 12, 2012

(65) Prior Publication Data
US 2013/0113757 A1    May 9, 2013

(30) Foreign Application Priority Data
Jul. 9, 2010   (JP) .................................. 2010-156488

(51) Int. Cl.
*H05K 1/03*   (2006.01)
*G06F 3/044*  (2006.01)
(Continued)

(52) U.S. Cl.
CPC ............ *H05K 1/0313* (2013.01); *C08J 7/042* (2013.01); *G06F 3/044* (2013.01); *H05K 3/0064* (2013.01);
(Continued)

(58) Field of Classification Search
CPC ............... H05K 3/0064; H05K 1/0313; H05K 2201/0104; H05K 2201/0323;
(Continued)

(56) References Cited

U.S. PATENT DOCUMENTS

2002/0158853 A1   10/2002   Sugawara et al.
2008/0118669 A1*  5/2008    Inoue ...................... G02B 1/111
                                                              428/1.31
(Continued)

FOREIGN PATENT DOCUMENTS

CN        1502048        6/2004
CN        101226450      7/2008
(Continued)

OTHER PUBLICATIONS

"Office Action of Japan Counterpart Application", dated Mar. 17, 2015, pp. 1-12, with partial English translation thereof.
(Continued)

*Primary Examiner* — Ruiyun Zhang
(74) *Attorney, Agent, or Firm* — JCIPRNet

(57) ABSTRACT

Provided is a transparent conductive film having multilayer structure, and inconspicuous pattern shape and good visibility. The film includes: transparent base 11 formed of film-like polymer resin; first hard coat layer 12 laminated on the base 11; first transparent dielectric layer 13 laminated as required on the layer 12; and first transparent conductive layer 14 laminated on the layer 13. The base 11 has a film thickness of 2 to 250 micrometers. The layer 12 is formed of hardening resin containing inorganic oxide, with refractive index: 1.40 to 1.90 and film thickness: 0.5 to 6 micrometers. The layer 13 is formed of inorganic substance, with refractive index: 1.30 to 1.50 and film thickness: 10 to 50 nanometers. The layer 14 is formed of at least one kind of
(Continued)

inorganic oxide, metal and carbon, and patterned, and has a film thickness of 10 nanometers to 2 micrometers.

5 Claims, 7 Drawing Sheets

(51) Int. Cl.
  *H05K 3/00* (2006.01)
  *C08J 7/04* (2006.01)
(52) U.S. Cl.
  CPC ........ *C08J 2367/02* (2013.01); *C08J 2433/00* (2013.01); *G06F 2203/04103* (2013.01); *Y10T 156/10* (2015.01); *Y10T 428/1055* (2015.01)
(58) Field of Classification Search
  CPC ............ H05K 2201/0326; G06F 3/044; G06F 2203/0413; C08J 7/042; C08J 7/045; Y10T 428/10; Y10T 428/1055; G09G 2330/04; G02F 1/13338
  USPC ..................... 428/1.4; 345/173, 174; 156/60; 174/255; 385/130, 131
  See application file for complete search history.

(56) References Cited

U.S. PATENT DOCUMENTS

| | | |
|---|---|---|
| 2008/0176042 A1 | 7/2008 | Nashiki et al. |
| 2010/0013784 A1* | 1/2010 | Nashiki et al. ............... 345/173 |
| 2011/0141059 A1* | 6/2011 | Nashiki ................... G06F 3/044 345/174 |
| 2011/0141065 A1* | 6/2011 | Noguchi ................. G06F 3/041 345/176 |

FOREIGN PATENT DOCUMENTS

| | | | |
|---|---|---|---|
| JP | 11-286066 | | 10/1999 |
| JP | 11286066 A | * | 10/1999 |
| JP | 2003-197035 | | 7/2003 |
| JP | 2005-018551 | | 1/2005 |
| JP | 2007-508639 | | 4/2007 |
| JP | 2009-076432 | | 4/2009 |
| JP | 4364938 | | 11/2009 |
| JP | 2010-015681 | | 1/2010 |
| JP | 2010-023282 | | 2/2010 |
| JP | 2010-027294 | | 2/2010 |
| JP | 2010-115818 | | 5/2010 |
| JP | 2010-140859 | | 6/2010 |
| JP | 2010-208169 | | 9/2010 |
| KR | 20010093732 | | 10/2001 |
| KR | 20060109939 | | 10/2006 |
| KR | 20100008758 | | 1/2010 |
| TW | 201009854 | | 3/2010 |

OTHER PUBLICATIONS

"First Office Action of China Counterpart Application", dated Mar. 16, 2015, pp. 1-17, with English translation thereof.
"Second Office Action of China Counterpart Application", dated Oct. 16, 2015, pp. 1-19, with English translation thereof.
"Office Action of Taiwan Counterpart Application", dated Jul. 22, 2015, p. 1-p. 11.
"Office Action of Japan Counterpart Application", dated Mar. 15, 2016, p. 1-p. 6, with partial English translation thereof.
"Office Action of Korean Counterpart Application", dated Mar. 22, 2017, with partial English translation thereof, p. 1-p. 7.

* cited by examiner

*FIG. 7*

Example 1

| ITO |
|---|
| SiO$_2$ |
| A1 |
| PET |
| B1 |

Example 2

| ITO |
|---|
| SiO$_2$ |
| A2 |
| PET |
| B2 |

Example 3

| ITO |
|---|
| SiO$_2$ |
| A3 |
| PET |
| B3 |

Example 4

| ITO |
|---|
| SiO$_2$ |
| A4 |
| PET |
| B4 |

Comparative Example 1

| ITO |
|---|
| SiO$_2$ |
| PET |
| B5 |

Comparative Example 2

| ITO |
|---|
| SiO$_2$ |
| A6 |
| PET |
| B6 |

Example 5

| Ag |
|---|
| A4 |
| PET |
| B4 |

Comparative Example 3

| Ag |
|---|
| A6 |
| PET |
| B6 |

Example 6

| C |
|---|
| A4 |
| PET |
| B4 |

Comparative Example 4

| C |
|---|
| A6 |
| PET |
| B6 |

TRANSPARENT CONDUCTIVE FILM AND METHOD FOR PRODUCING SAME

CROSS-REFERENCE TO RELATED APPLICATION

This application is a 371 of international application of PCT application serial no. PCT/JP2011/065406, filed on Jul. 5, 2011, which claims the priority benefit of Japan application no. 2010-156488, filed on Jul. 9, 2010. The entirety of each of the above-mentioned patent applications is hereby incorporated by reference herein and made a part of this specification.

TECHNICAL FIELD

The present invention relates to a transparent conductive film. In particular, the invention relates to a transparent conductive film in which a hard coat layer having a controlled refractive index, a transparent dielectric layer and a transparent conductive layer are laminated in the order on a base formed of a transparent plastic film, and a method for producing the same.

BACKGROUND ART

A transparent conductive film in which a transparent and conductive thin film is laminated on a base formed of a transparent plastic film has been widely used in an application utilizing conductivity thereof, for example, a flat panel such as a liquid crystal display, or a touch panel to be mounted on a smart phone, a car navigation system and a digital camera.

The touch panel includes an optical type, an ultrasonic type, an electromagnetic induction type, a capacitive type and a resistive type according to a position detection system. A resistive touch panel has a structure in which the transparent conductive film and a glass substrate on which a transparent conductive layer (indium tin oxide (hereinafter, abbreviated as "ITO")) is laminated are opposed through a dot spacer. When the transparent conductive film is pressed, the transparent conductive layer (ITO) on one of opposed glass substrates and the transparent conductive layer (ITO) of the transparent conductive film on the other of opposed glass substrates are electrically connected on a point where the dot spacer is absent, and thus a position is determined. Therefore, a service life due to a decrease in strength of the dot spacer or ITO becomes problematic. On the other hand, a capacitive touch panel has on a base a transparent conductive layer subjected to patterning. When the panel is touched with a finger or the like, a capacitance of the finger is detected to cause a change of a resistance value between a touched point and the transparent conductive layer subjected to patterning, and thus two-dimensional position information is accurately detected. Owing to the structure, the panel has features of having no movable part, and has a high reliability, a long service life, and excellent optical features such as transparency.

As described above, for the touch panel, predetermined patterning is applied to the transparent conductive layer or the like of the transparent conductive film in some cases in order to detect an input position. However, patterning clearly defines optical characteristics between a patterned part (part in which the transparent conductive layer or the like exists) and a non-patterned part (pattern opening part in which the transparent conductive layer or the like is removed), and appearance as a display device is potentially deteriorated. In particular, according to the capacitive touch panel, the transparent conductive layer is formed on a front face of a display part. Therefore, a panel having a good appearance even when the transparent conductive layer is subjected to patterning is required therefore.

The transparent conductive film that has so far been applied includes a transparent conductive film having a film on which a conductive layer is formed, a conductive layer, an undercoat layer (except for a layer having conductivity) composed of a metal oxide as formed between the film on which the conductive layer is formed, and the conductive layer, and a metal layer composed of a single metal element or an alloy containing two or more kinds of metal elements including at least one kind contained in the metal oxide as formed between the undercoat layer and the film on which the conductive layer is formed (Patent literature No. 1, paragraph 0007). As a specific example, a constitution is disclosed in which a 1 nm-thick silicon layer, a 60 nm-thick zinc oxide-tin oxide layer, a 45 nm-thick silicon oxide layer, and a 30 nm-thick ITO layer are sequentially laminated on a face on one side of a PET film (see Patent literature No. 1, for example).

As one of other transparent conductive films, a transparent conductive film is also disclosed in which at least a high refractive index layer, a low refractive index layer and a transparent conductive layer are arranged on one face of a transparent plastic film, and a hard coat layer is arranged on the other one face of the transparent plastic film, and a hard coat layer is arranged between the transparent plastic film and the high refractive index layer (see Patent literature No. 2, for example).

PRIOR ART DOCUMENT

Patent Document

Patent Document 1: JP 2003-197035 A.
Patent Document 2: JP H11-286066 A.

DISCLOSURE OF INVENTION

Problem to be Solved by the Invention

However, when the transparent conductive films described above are used for a capacitive touch panel, if a conductive layer (transparent conductive layer) is subjected to patterning, such a defect has been found as a conspicuous pattern shape of the conductive layer.

Therefore, an objective of the invention is to provide a transparent conductive film that has a multilayer structure and an inconspicuous pattern shape of the transparent conductive layer as the conductive layer, and a good visibility, and a method for producing the same.

Means for Solving the Problem

The present inventors have diligently continued to conduct research for achieving the objective described above. As a result, the present inventors have found that a difference in optical characteristics between a patterned part and a non-patterned part can be suppressed by optimizing thickness (film thickness) and a refractive index of each layer in a hard coat layer, a transparent dielectric layer and a transparent conductive layer of a transparent conductive film, and thus have completed the invention.

As shown in FIG. 1 for example, a transparent conductive film according to a first aspect of the invention has a transparent base 11 formed of a film-like polymer resin; a first hard coat layer 12 laminated on one face of the base 11; a first transparent dielectric layer 13 laminated on a face of the first hard coat layer 12 on a side opposite to the base 11; and a first transparent conductive layer 14 laminated on a face of the first transparent dielectric layer 13 on a side opposite to the hard coat layer 12. The base 11 has a film thickness of 2 to 250 micrometers. The first hard coat layer 12 is formed of a hardening resin containing an inorganic oxide, and has a refractive index of 1.40 to 1.90 and a film thickness of 0.5 to 6 micrometers. The first transparent dielectric layer 13 is formed of an inorganic substance, and has a refractive index of 1.30 to 1.50 and a film thickness of 10 to 50 nanometers. The first transparent dielectric layer 13 is laminated as required. The first transparent conductive layer 14 is formed of at least one kind selected from the group of an inorganic oxide, a metal and carbon, and subjected to patterning, and simultaneously has a film thickness of 10 nanometers to 2 micrometers.

In addition, "patterning" means formation of a predetermined shape on the transparent conductive layer by an etching method, a laser ablation method, screen printing or the like. The transparent conductive film has a part having the transparent conductive layer (patterned part: P), and a part having no transparent conductive layer (non-patterned part: NP) formed by patterning.

When such a constitution is adopted, each of the hard coat layer, the transparent dielectric layer laminated as required, and the transparent conductive layer has a suitable refractive index and a suitable film thickness. Therefore, a transparent conductive film having an inconspicuous pattern shape and a good visibility can be obtained. Furthermore, the hard coat layer is formed of the hardening resin containing the inorganic oxide. Therefore, a desired refractive index can be easily obtained by adjusting a type and an amount of the inorganic oxide to be contained. Moreover, the hard coat layer is formed of the hardening resin. Therefore, a low molecular weight material such as an oligomer is prevented from being eluted, by heat treatment or the like in a production step, from the base formed of a polymer resin, and thus an influence on the transparent dielectric layer can be suppressed.

As for a transparent conductive film according to a second aspect of the invention, in the transparent conductive film according to the first aspect of the invention, the base 11 is formed of at least one kind selected from polyethylene terephthalate, polyethylene naphthalate, triacetyl cellulose and polycarbonate. The hardening resin forming the first hard coat layer 12 is an ultraviolet curing resin. The first transparent dielectric layer 13 laminated as required is formed of silicon oxide ($SiO_2$). The first transparent conductive layer 14 is formed of at least one kind selected from the group of indium tin oxide, indium zinc oxide, gallium-added zinc oxide, aluminum-added zinc oxide, silver, copper and carbon.

When patterning is performed by etching the first transparent conductive layer using an acid solution, degradation of the first hard coat layer can be prevented by including the first transparent dielectric layer formed of high acid-resistant silicon dioxide. Moreover, when the first transparent conductive layer is formed using a metal oxide including at least one kind selected from the group of indium tin oxide, indium zinc oxide, gallium-added zinc oxide and aluminum-added zinc oxide, close contact of the first transparent conductive layer can be further improved by having the first transparent dielectric layer. Furthermore, when the transparent conductive film has the first transparent dielectric layer, the number of layers of the transparent conductive film is increased. Therefore, adjustment of a refractive index of the transparent conductive film as a whole becomes easier.

A transparent conductive film according to a third aspect of the invention is constituted as shown in FIG. 3 for example. In the transparent conductive film according to the first aspect of the second aspect of the invention, the transparent conductive film has a second hard coat layer 12' laminated on the other face of the base 11; and the second hard coat layer 12' is formed of a hardening resin.

When such a constitution is adopted, the hard coat layers are laminated on both faces of the base. Therefore, deformation (curling, for example) of the base formed of the polymer resin can be suppressed during heat treatment. Furthermore, when the second hard coat layer contains no inorganic oxide, material preparation work can be saved. Therefore, productivity can be improved. Furthermore, production cost of the hard coat layer can be reduced.

As for a transparent conductive film according to a fourth aspect of the invention, in the transparent conductive film according to the third aspect of the invention, the second hard coat layer 12' is formed of an inorganic oxide and a hardening resin identical with the oxide and the resin in the first hard coat layer 12, respectively.

When such a constitution is adopted, the first hard coat layer and the second hard coat layer can be produced by using the identical materials. Therefore, productivity can be improved.

A transparent conductive film according to a fifth aspect of the invention is constituted as shown in FIG. 4 for example. In the transparent conductive film according to the fourth aspect of the invention, the transparent conductive film has a second transparent dielectric layer 13' laminated as required on a face of the second hard coat layer 12' on a side opposite to the base 11; and a second transparent dielectric layer 14' laminated on a face of the second transparent conductive layer 13' on a side opposite to the second hard coat layer 12'. The second hard coat layer 12' has a refractive index of 1.40 to 1.90 and a film thickness of 0.5 to 6 micrometers. The second transparent dielectric layer 13' laminated as required is formed of an inorganic substance, and has a refractive index of 1.30 to 1.50 and a film thickness of 10 to 50 nanometers. The second transparent conductive layer 14' is formed of at least one kind selected from the group of an inorganic oxide, a metal and carbon, and subjected to patterning, and simultaneously has a film thickness of 10 nanometers to 2 micrometers.

When such a constitution is adopted, each pattern of the transparent conductive layers 14 and 14' can be formed in a different shape. Therefore, the film can be formed as a transparent conductive film suitable for a projected capacitive touch panel.

As shown in FIG. 5 for example, an image display apparatus according to a sixth aspect of the invention has a touch panel 43 having the transparent conductive film according to any one of the first aspect to the fifth aspect of the invention; and an image panel 41 arranged on a side opposite to the first hard coat layer 12 of the transparent conductive film.

When such a constitution is adopted, the touch panel has the transparent conductive film having the inconspicuous pattern shape of the transparent conductive layer. Therefore, an image display apparatus in which visibility of a display on the image panel is improved can be obtained.

As shown in FIG. 6 for example, a method for producing a transparent conductive film according to a seventh aspect of the invention includes a step (S01) for laminating a hard coat layer 12 on one face of a transparent base 11 formed of a film-like polymer resin by a wet coating method; a step (S02) for laminating, as required, a transparent dielectric layer 13 on a face of the hard coat layer 12 on a side opposite to the base 11; a step (S03) for laminating a transparent conductive layer 14 on a face of the transparent dielectric layer 13 on a side opposite to the hard coat layer 12; and a step (S04) for patterning the transparent conductive layer 14. The base 11 has a film thickness of 2 to 250 micrometers. The hard coat layer 12 is formed of a hardening resin containing an inorganic oxide, and has a refractive index of 1.40 to 1.90 and a film thickness of 0.5 to 6 micrometers. The transparent dielectric layer 13 laminated as required is formed of an inorganic substance, and has a refractive index of 1.30 to 1.50 and a film thickness of 10 to 50 nanometers. The transparent conductive layer 14 is formed of an inorganic oxide, and has a film thickness of 10 nanometers to 2 micrometers.

When such a constitution is adopted, each of the hard coat layer, the transparent dielectric layer laminated as required, and the transparent conductive layer has a suitable refractive index and a suitable film thickness. Therefore, the constitution provides a method for producing the transparent conductive film having the inconspicuous pattern shape and the good visibility. Furthermore, the hard coat layer is formed of the hardening resin containing the inorganic oxide. Therefore, a hard coat layer having a desired refractive index can be easily produced by adjusting a type and an amount of the inorganic oxide to be contained. Moreover, the hard coat layer is formed of the hardening resin. Therefore, the low molecular weight material such as the oligomer is prevented from being eluted, by heal treatment or the like in the production step, from the base formed of the polymer resin, and thus the influence on the transparent dielectric layer can be suppressed. Furthermore, the hard coat layer can be laminated at a line speed of several tens of meters per minute (about 20 meters per minute, for example) by applying the wet coating method. Therefore, the transparent conductive film can be produced in bulk and production efficiency can be increased.

Effect of the Invention

A transparent conductive film of the invention can make a pattern shape applied to a transparent conductive layer less conspicuous by adjusting a refractive index and a film thickness of the transparent conductive layer, a transparent dielectric layer laminated as required, and also a hard coat layer, respectively. Therefore, a transparent conductive film that has a multilayer structure and a good visibility can be obtained.

BRIEF DESCRIPTION OF DRAWINGS

FIG. 7 is a diagram each showing a layer constitution in Examples 1 to 6 and Comparative Examples 1 to 4.

BEST MODE FOR CARRYING OUT THE INVENTION

The present application is based on Japanese Patent Application No. 2010-156488 applied on Jul. 9, 2010 in Japan. The content forms part thereof as the content of the present application. The invention will be more completely understood by the detailed description provided hereinafter. Further areas of applicability of the invention will become more apparent from the detailed description provided hereinafter. However, it should be understood that the detailed description and specific examples indicate desired embodiments of the invention, and are provided for the purpose of illustration only because it will be apparent to those skilled in the art that various modifications and variations can be made without departing from the spirit or scope of the invention from the detailed description. Applicants have no intention to present any described embodiments to the public, and among modifications and variations, the subject matter that may not be fallen within the scope of claims should also be part of the invention under the doctrine of equivalents.

Hereinafter, the embodiments of the invention will be explained with reference to drawings. In addition, an identical or similar symbol is attached to a mutually identical part or a corresponding part in each drawing, and an overlapped explanation is omitted. Moreover, the invention is in no way limited to embodiments as described below.

Next, the invention will be specifically explained.

Transparent Conductive Film 10

Figure 1:
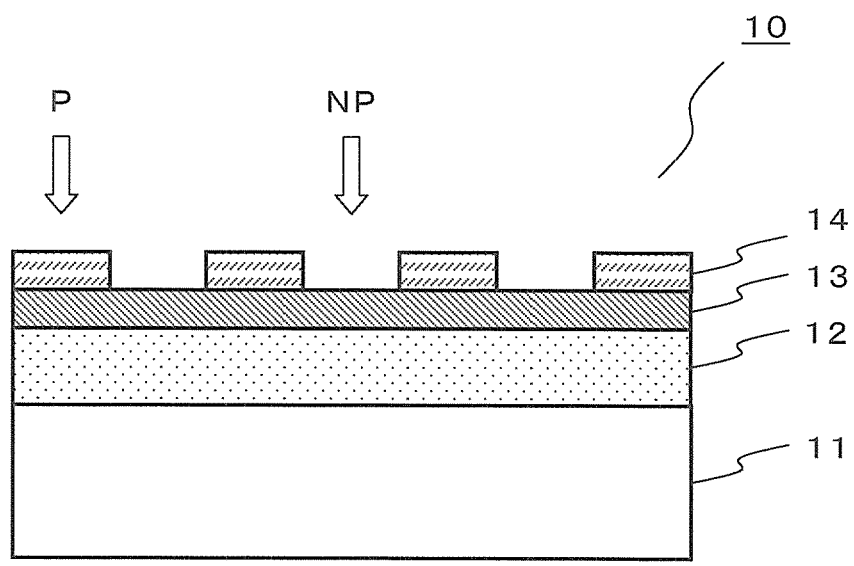
FIG. 1 is a cross-sectional view explaining a layer constitution of a transparent conductive film 10 constituted in a multilayer (in a case of having a transparent dielectric layer 13).

With reference to FIG. 1, a transparent conductive film 10 according to a first embodiment of the invention will be explained. In addition, FIG. 1 is a drawing explaining a layer constitution of the transparent conductive film 10 constituted in a multilayer, and a thickness of each layer is exaggerated. The transparent conductive film 10 has a transparent plastic base 11 as a base, a hard coat layer 12, a transparent dielectric layer 13 as required, and a transparent conductive layer 14. As shown in FIG. 1, the hard coat layer 12 is laminated on one face of the transparent plastic base 11 (on an upper side of the transparent plastic base 11 in FIG. 1). The transparent dielectric layer 13 is further laminated as required on the hard coat layer 12. The transparent conductive layer 14 is further laminated on the transparent dielectric layer 13. Thus, the transparent conductive film 10 is constituted in the multilayer.

Transparent Plastic Base 11

The transparent plastic base 11 means a transparent base 11 formed of a film-like polymer resin. Various kinds of plastic films having transparency can be used for the transparent plastic base 11 as the film-like polymer resin. Specific examples of a material of the plastic films having transparency include a resin such as a polyester resin, an acetate resin, a polyethersulfone resin, a polycarbonate resin, a polyamide resin, a polyimide resin, a polyolefin resin, a (meth)acrylic resin, a polyvinyl chloride resin, a polyvinylidene chloride resin, a polystyrene resin, a polyvinyl alcohol resin, a polyarylate resin, a polyphenylene sulfide resin and a norbornene resin. Specifically, such a resin is preferred as polyethylene terephthalate (PET), polyethylene naphthalate, triacetyl cellulose, polyethersulfone, polycarbonate, polyarylate and polyether ether ketone. In addition, polyethylene terephthalate and polyethylene naphthalate are further preferred because of an excellent mechanical strength, dimensional stability, heat resistance, chemical resistance, optical characteristics or the like, and an excellent film surface smoothness or handling properties. Polycarbonate is further preferred because of an excellent transparency, impact resistance, heat resistance, dimensional stability or flammability. Polyethylene terephthalate is particularly preferred in consideration of a price and availability.

A film thickness of the transparent plastic base 11 is 2 to 250 micrometers, preferably, 10 to 200 micrometers, particularly preferably, 20 to 190 micrometers. When the film thickness of the transparent plastic base 11 is less than 2 micrometers, mechanical strength of the base is insufficient, and a work such as formation of the transparent conductive layer 14 and pattern formation for the transparent conductive film 10 becomes difficult. Moreover, when the film thickness exceeds 250 micrometers, a thickness of a touch panel becomes large, and therefore the film becomes unsuitable for a mobile device such as a cell phone and a portable music terminal.

The transparent plastic base 11 is preferably subjected to surface activation treatment such as easy-adhesion treatment (treatment for in-line application of an easy-adhesive upon forming a film of the transparent plastic base to improve close contact between the transparent plastic base and the hard coat layer), primer coating treatment (treatment for off-line application of a primer coating agent after forming the film of the transparent plastic base to improve the close contact between the transparent plastic base and the hard coat layer), corona discharge treatment, flame treatment, ultraviolet irradiation treatment, electron beam irradiation treatment, ozone treatment, glow discharge treatment and sputtering treatment. The surface activation treatment allows improvement of the close contact between the transparent plastic base 11 and the hard coat layer 12 to be arranged on the base.

The hard coat layer 12 mainly formed of a hardening resin is arranged on the transparent plastic base 11. The hard coat layer 12 allows countermeasures against optical interference of the transparent plastic base 11, countermeasures against curling, provision of chemical resistance thereto, and prevention of precipitation of a low molecular weight material such as an oligomer.

Hard Coat Layer 12

The hard coat layer 12 is formed by laminating the hardening resin on the transparent plastic base 11, and hardening the resultant coating film. A wet coating method for uniformly coating a resin dissolved in a solvent is preferably applied to lamination of the hardening resin. As the wet coating method, a gravure coating method, a die coating method or the like can be applied. The gravure coating method is a system for immersing into a coating liquid a gravure roll on which surface uneven engraving processing is applied, scraping the coating liquid deposited on an uneven part on a surface of the gravure roll with a doctor blade to collect the liquid in a recess, and thus accurately metering the liquid herein to transfer the liquid to the base. The gravure coating method allows thin coating of a low-viscosity liquid. The die coating method is a system for performing coating while pressurizing and extruding a liquid from a coating head referred to as a die. The die coating method allows coating with a high precision. Furthermore, a change in concentration of a coating liquid due to drying is hard to occur because the liquid is not exposed to open air. Specific examples of other wet coating methods include a spin coating method, a bar coating method, a reverse coating method, a roll coating method, a slit coating method, a dipping method, a spray coating method, a kiss coating method, a reverse kiss coating method, an air knife coating method, a curtain coating method and a lot coating method. A method for laminating the resin on the base can be appropriately selected from the methods according to a film thickness required. Furthermore, application of the wet coating method allows lamination at a line speed of several tens of meters per minute (about 20 meters per minute, for example). Therefore, the transparent conductive film can be produced in bulk and production efficiency can be increased.

Herein, the hardening resin means a resin that is hardened by heating, irradiation with ultraviolet light, irradiation with electron beams, or the like. Specific examples of the hardening resin include a silicone resin, an acrylic resin, a methacrylic resin, an epoxy resin, a melamine resin, a polyester resin and a urethane resin. From a viewpoint of productivity, an ultraviolet curing resin is preferred among the hardening resins. The ultraviolet curing resin is ordinarily used by adding a photopolymerization initiator. Specific examples of the photopolymerization initiator include various kinds of benzoin derivatives, benzophenone derivatives and phenyl ketone derivatives. An amount of adding the photopolymerization initiator is preferably 1 to 5 parts by weight based on 100 parts by weight of the ultraviolet curing resin. In addition, the hardening resin is preferably liquid before hardening because the resin is used as the coating liquid.

Concentration of a hardening resin component of the coating liquid (hard coat layer-coating liquid) can be appropriately selected by adjusting the liquid to a viscosity according to a lamination method such as the wet coating method. The concentration is preferably in the range of 5 to 80% by weight, further preferably, in the range of 10 to 60% by weight. As a dilution solvent, methyl isobutyl ketone or the like can be used. Moreover, other publicly known additives, for example, a leveling agent such as a surfactant can also be added to the coating liquid as required. Addition of the leveling agent allows control of surface tension of the coating liquid, and suppression of a surface defect caused during formation of the hard coat layer, such as a repulsion and a crater.

An inorganic oxide is added to the hard coat layer-coating liquid in order to adjust a refractive index of the hard coat layer 12 after hardening the resin. Specific examples of a material of the inorganic oxide contained in the hard coat layer include $SiO_2$, $Al_2O_3$, $SnO_2$, $ZrO_2$ and $TiO_2$, and a composite oxide thereof. A material in which a plurality of inorganic oxides are mixed may also be used. In order to prevent a decrease in transparency of the hard coat layer 12, a mean particle diameter of the inorganic oxide is preferably in the range of 1 to 100 nanometers. An amount of adding the inorganic oxide is preferably in the range of 5 to 50% by weight, further preferably, 10 to 40% by weight, based on the resin solid, although the range is influenced by specific gravity or the like. Thus, the inorganic oxide is added to the hard coat layer. Therefore, a hard coat layer having a desired refractive index can be easily obtained by adjusting a type and an amount of the inorganic oxide to be added.

The refractive index of the hard coat layer 12 is 1.40 to 1.90, preferably, 1.55 to 1.80. When the refractive index is less than 1.40, a difference in refractive index between the hard coat layer 12 and transparent dielectric layer 13 becomes small. Therefore, a difference in optical characteristics between the patterned part and the non-patterned part becomes large upon patterning the transparent conductive layer 14, and the patterned part tends to be easily visible. On the other hand, when the refractive index exceeds 1.90, for example, in the case where PET is used for the transparent plastic base 11, a difference in refractive index between the hard coat layer 12 and the transparent plastic base 11 becomes large. Therefore, visibility of the transparent conductive film 10 decreases by interference or the like.

The film thickness of the hard coat layer 12 is 0.5 to 6 micrometers, preferably, 0.5 to 1.5 micrometers. When the film thickness is less than 0.5 micrometer, formation of a crosslinked structure of the hardening resin becomes hard. Therefore, a decrease in durability or chemical resistance is caused. On the other hand, when the film thickness exceeds 6 micrometers, the film thickness becomes exceedingly large. Therefore, a decrease in transparency such as total luminous transmittance is caused.

Specific examples of hardening treatment for hardening the hardening resin include heating, irradiation with ultraviolet light, and irradiation with electron beams. In addition, when the dilution solvent is contained in the coating film, the hardening treatment is preferably performed after removing the dilution solvent remaining in the coating film by heating the coating film for several tens of minutes within the range of 70 to 200° C. As hardening by heating, for example, heating may be performed at a heating temperature, ordinarily from 80 to 250° C., preferably, 100 to 200° C. On the occasion, when an oven is used, heating may be performed for 30 to 90 minutes, and when a hot plate is used, heating may be performed for 5 to 30 minutes. Moreover, as hardening by irradiation with ultraviolet light, the coating liquid may be irradiated with ultraviolet light in a wavelength of 200 to 400 nanometers from a UV lamp (a high pressure mercury lamp, an ultra-high pressure mercury lamp, a metal halide lamp, a high power metal halide lamp, for example) for a short period of time (within the range of several seconds to several tens of seconds). Moreover, as hardening by irradiation with electron beams, the coating liquid may be irradiated with low energy electron beams of 300 keV or less from a self-shielding low energy electron accelerator.

Transparent Dielectric Layer 13

Specific examples of a material of the transparent dielectric layer 13 include an inorganic substance such as NaF, $BaF_2$, LiF, $MgF_2$, $CaF_2$ and $SiO_2$. Among the materials, $SiO_2$ is preferred. $SiO_2$ has a high acid resistance. Therefore, $SiO_2$ allows prevention of degradation of the hard coat layer 12 when the transparent conductive layer 14 is subjected to patterning by etching the layer with an acid solution or the like.

Specific examples of the method for forming the transparent dielectric layer 13 include a dry process such as a sputtering method, a vacuum deposition method and an ion plating method, and a wet method for forming the transparent dielectric layer by coating a silica sol or the like. The method can be appropriately selected according to the film thickness required. Application of the dry process allows preparation of a film having a thickness from several nanometers and preparation of a film having an excellent uniformity and smoothness, and therefore is preferred. In particular, selection of a material having a high purity for a sputtering target (film formation material) allows preparation of a film having less dust or particles, and therefore is preferred. Moreover, use of silica sol allows easy film formation, and therefore is preferred.

The refractive index of the transparent dielectric layer 13 is 1.30 to 1.50, preferably, 1.40 to 1.50. When the refractive index is less than 1.30, the film becomes porous. Therefore, when the transparent conductive layer 14 is laminated, the transparent conductive layer 14 is hard to be a uniform film, and electric characteristics are degraded. On the other hand, when the refractive index exceeds 1.50, a difference in refractive index between the transparent dielectric layer 13 and the transparent conductive layer 14 becomes small. Therefore, when the transparent conductive layer 14 is subjected to patterning, bringing the optical characteristics close between the patterned part and the non-patterned part becomes difficult.

The film thickness of the transparent dielectric layer 13 is 10 to 50 nanometers, preferably, 15 to 45 nanometers, particularly preferably, 20 to 30 nanometers. When the film thickness is less than 10 nanometers, the layer 13 becomes a discontinuous film and stability of the film is decreased. On the other hand, when the film thickness exceeds 50 nanometers, a decrease in transparency is caused.

Transparent Conductive Layer 14

Specific examples of a material of the transparent conductive layer 14 include zinc oxide, tin oxide, aluminum oxide, titanium oxide, indium oxide, indium tin oxide (ITO), indium zinc oxide (IZO), gallium-added zinc oxide, fluorine-added tin oxide, antimony-added tin oxide, aluminum-added zinc oxide (AZO), silicon-added zinc oxide, silver, copper and carbon.

A value of surface resistance of the transparent conductive layer 14 is preferably in the range of 10 to 1,000Ω/□, further preferably, in the range of 30 to 500Ω/□. In order to form a continuous film having the value of surface resistance, the film thickness of the transparent conductive layer 14 is preferably 10 to 300 nanometers, further preferably, 20 to 200 nanometers.

Specific examples of a method for forming the transparent conductive layer 14 include a wet method using a coating liquid mainly formed of an inorganic oxide, and a dry process such as a sputtering method, an ion plating method, an electron beam deposition method and a chemical vapor deposition method (CVD). Application of the dry process allows preparation a film having a thickness from several nanometers and preparation of a film having an excellent uniformity and smoothness, and therefore is preferred. In particular, selection of a material having a high purity for a sputtering target (film formation material) allows preparation of a film having less dust or particles, and therefore is preferred. In particular, when a film of ITO is formed, according to the dry process, a ratio of tin to indium in ITO to be subjected to film formation can be changed by changing a ratio of tin oxide of a target material to indium oxide thereof. As a result, the refractive index (optical characteristics) of ITO or the like can be changed. Application of the wet process allows simple film formation by printing or the like by forming ITO, IZO, silver, copper, carbon or the like into paint, allying the paint, and subjecting the resulting coating to heating and drying, and fusion bonding. Therefore, the application is preferred.

Figure 2A:
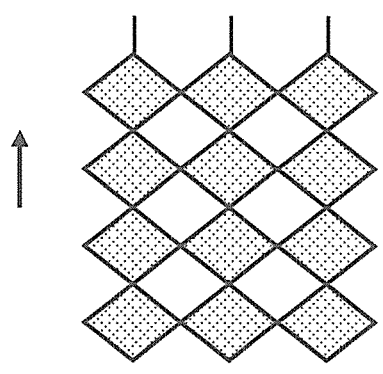
FIGS. 2A and 2B each are a diagram showing one example of a pattern shape formed on a transparent conductive layer.
Figure 2B:
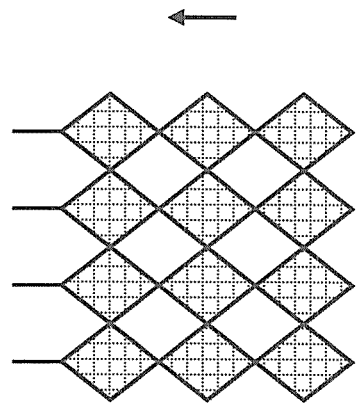

The transparent conductive layer 14 is formed, and then subjected to etching and patterning. Patterning allows formation of various kinds of patterns according to an application for which the transparent conductive film 10 is adapted. A mask part having a desired pattern shape is formed on a surface of the transparent conductive layer 14, an exposed part is removed with an etching solution or the like, and then the mask part is dissolved with an alkali solution or the like, and thus the transparent conductive layer 14 is subjected to patterning. As the etching solution, an acid is suitably used. Specific examples of the acid include an inorganic acid such as hydrogen chloride, hydrogen bromide, nitric acid, sulfuric acid and phosphoric acid, an organic acid such as acetic acid and oxalic acid, and a mixture thereof, and an aqueous solution thereof. However, a patterning method is not limited thereto, and a method such as a laser ablation method and a screen printing method may also be applied. As the pattern shape, a diamond shape as shown in FIGS. 2A and 2B may also be formed, for example. However, the shape is not limited thereto, and may be triangular and quadrangular. In addition, the patterns shown in FIGS. 2A and 2B are electrically connected in arrow directions, respectively.

When at least one kind metal oxide selected from the group of indium tin oxide, indium zinc oxide, gallium-added zinc oxide and aluminum-added zinc oxide is used for the transparent conductive layer 14, the layer is subjected to patterning, and then annealing treatment is applied in the range of 100 to 150° C. in order to improve conductivity, and thus crystallization can be improved. As crystallinity of the transparent conductive layer 14 is higher, conductivity becomes more satisfactory. Therefore, the transparent plastic base 11 preferably has heat resistance at 150° C. or higher.

Transparent Conductive Film 20

Figure 3:
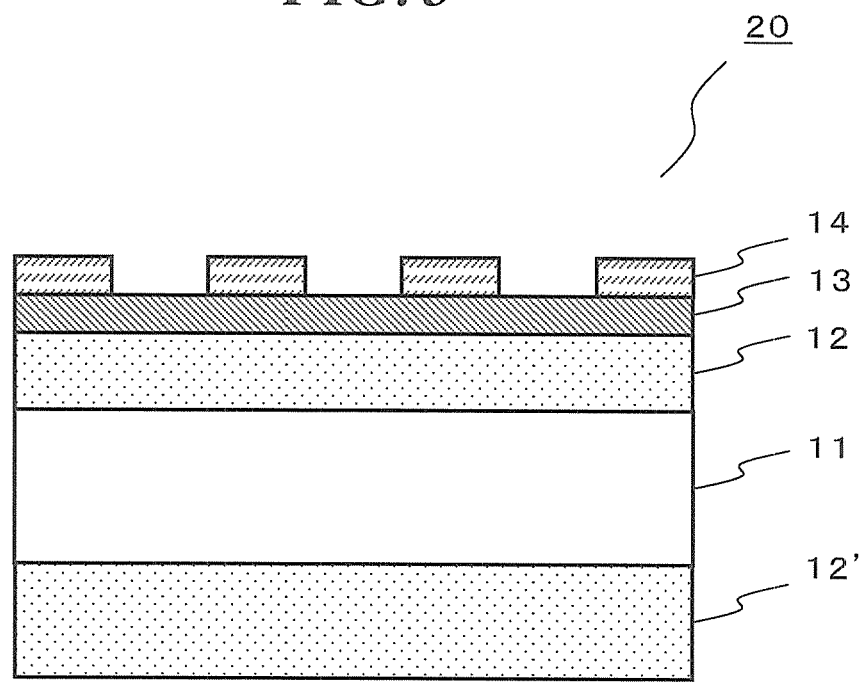
FIG. 3 is a cross-sectional view explaining a layer constitution of a transparent conductive film 20 constituted in a multilayer (in a case of having a transparent dielectric layer 13).

With reference to FIG. 3, a transparent conductive film 20 according to a second embodiment of the invention will be explained. The transparent conductive film 20 further has a hard coat layer 12' on a face of the transparent plastic base 11 shown in FIG. 1 on a side opposite to the hard coat layer 12. Thus, the transparent plastic base 11 forms a constitution in which the transparent plastic base 11 is interposed between the hard coat layers 12 and 12'. Therefore, curling of the transparent plastic base 11 can be further suppressed.

A material, a film thickness, a refractive index and an inorganic oxide to be contained may be identical or different between the hard coat layer 12' and the hard coat layer 12. Furthermore, the hard coat layer 12' needs not contain an inorganic oxide. For example, when a material and an inclusion are made identical between the hard coat layer 12' and the hard coat layer 12, and the hard coat layer 12' is made thicker, as compared with the hard coat layer 12, a film can be more easily formed and working efficiency can be improved.

Transparent Conductive Film 30

Figure 4:
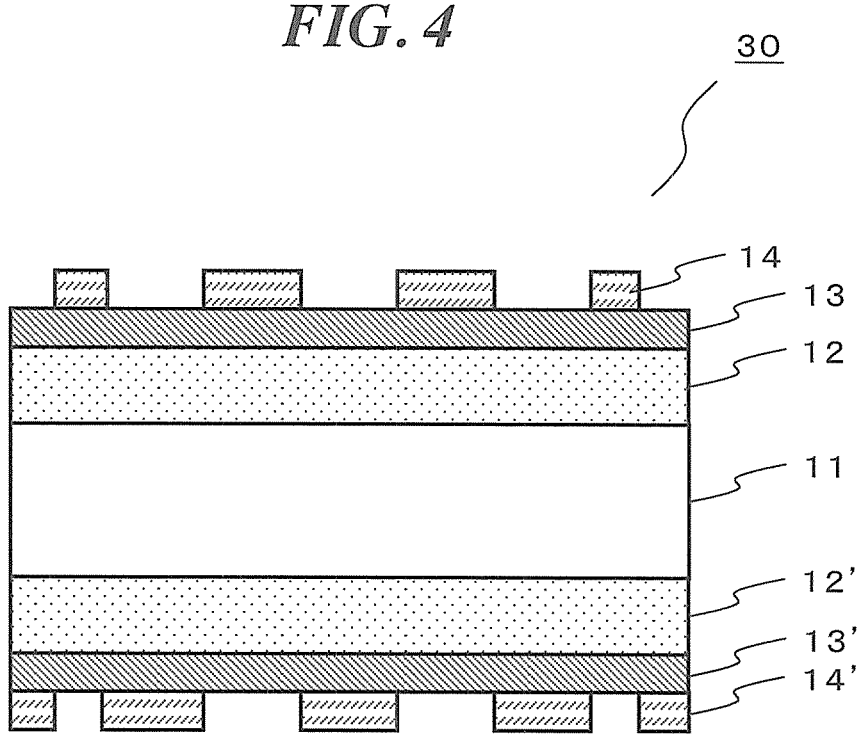
FIG. 4 is a cross-sectional view explaining a layer constitution of a transparent conductive film 30 constituted in a multilayer (in a case of having transparent dielectric layers 13 and 13').

With reference to FIG. 4, a transparent conductive film 30 according to a third embodiment of the invention will be explained. The transparent conductive film 30 further has a hard coat layer 12' on a face of the transparent plastic base 11 shown in FIG. 1 on a side opposite to the hard coat layer 12, and as required, a transparent dielectric layer 13' on a side opposite to the base 11, and a transparent conductive layer 14' on a side opposite to the layer 13'. As shown in FIG. 4, the hard coat layer 12' is laminated on the other face of the transparent plastic base 11 (on a lower side of the transparent plastic base 11 in FIG. 4). Under the hard coat layer 12', the transparent dielectric layer 13' is further laminated as required. Under the transparent dielectric layer 13', the transparent conductive layer 14' is further laminated. Thus, each layer is constituted symmetrically on both faces of the transparent plastic base 11.

Each pattern on the transparent conductive layers 14 and 14' as formed on both sides of the transparent plastic base 11 may be identical or different, preferably, different. For example, a pattern shown in FIG. 2A is formed on the transparent conductive layer 14. A pattern shown in FIG. 2B is formed on the transparent conductive layer 14' without overlapping with the pattern shown in FIG. 2A. On the occasion, the patterns shown in FIGS. 2A and 2B are formed such that directions of electric connection are intersected (including orthogonal intersection). Thus, when the transparent conductive film 30 is constituted by combining patterns of the transparent conductive layer 14 and patterns of the transparent conductive layer 14', the transparent conductive film 30 becomes suitable for a projected capacitive touch panel, and therefore is preferred.

In addition, the transparent conductive film 30 may have as required both of the transparent dielectric layer 13 and the transparent dielectric layer 13', or may have only any one of the layers, or may have no layer. Moreover, a material, a film thickness and a refractive index may be identical or different between the transparent dielectric layer 13' and the transparent dielectric layer 13. Furthermore, a material, a film thickness and a refractive index may be identical or different between the transparent dielectric layer 14' and the transparent dielectric layer 14.

Moreover, a constitution of each layer is not limited to a constitution of the transparent conductive films 10, 20 or 30, and may include any other constitution.

Image Display Apparatus 40

Figure 5:
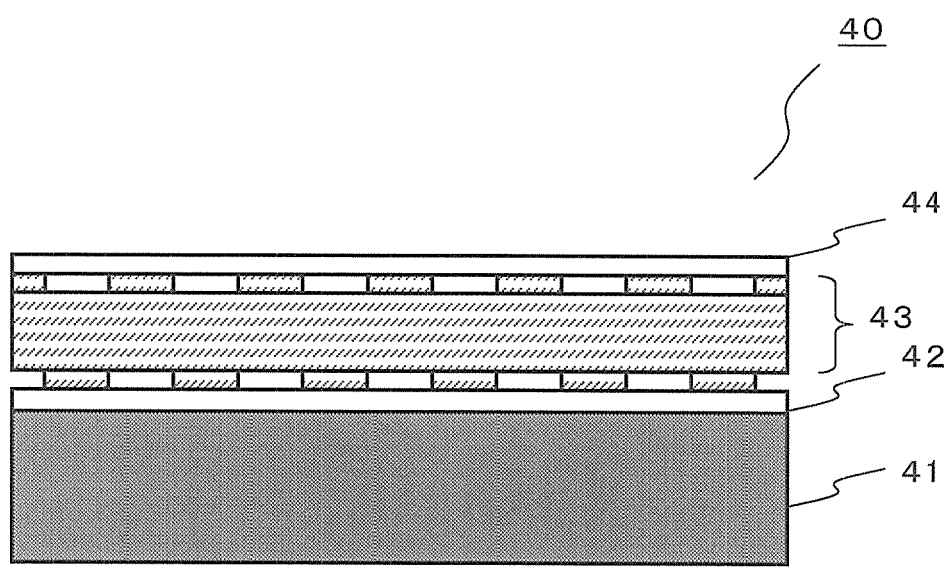
FIG. 5 is a cross-sectional view of an image display apparatus 40 provided with a touch panel having a transparent conductive film 30.

With reference to FIG. 5, an image display apparatus 40 according to a fourth embodiment of the invention will be explained. The image display apparatus 40 has an image panel 41 on which an image projected by mechanical processing is displayed, a shield layer 42, a touch panel 43 having the transparent conductive film 30 according to the invention, and a protective layer 44. As shown in FIG. 5, the shield layer 42 is laminated on the image panel 41 of a liquid crystal display or the like, and the touch panel 43 is further placed thereon such that the transparent conductive layer 14 subjected to patterning (see FIG. 4) is on an upper side. The protective layer 44 for protecting the touch panel 43 is further placed on the touch panel 43. In addition, an image display apparatus using the transparent conductive film of the invention is not limited to the image display apparatus 40, and may be a display apparatus having any other constitution. For example, the transparent conductive films 10 and 20 of the invention may be used. Furthermore, a plurality of the transparent conductive films 10 or a plurality of the transparent conductive films 20 may be laminated, individually, and thus may be used. For example, two transparent conductive films 10 may be stacked in a state in which the transparent conductive layer 14 faces upward, and thus may be used. In the case, the pattern shown in FIG. 2A may be formed on the transparent conductive layer 14 positioned above. Furthermore, the pattern shown in FIG. 2B may be formed on the transparent conductive layer 14 positioned below without overlapping with the pattern shown in FIG. 2A. On the occasion, the patterns shown in FIGS. 2A and 2B are preferably formed such that directions of electric connection may intersect with each other (including orthogonal intersection). Thus, two transparent conductive films 10 may be stacked, and the image display apparatus may be constituted such that patterns of two layers of the transparent conductive layers 14 are combined.

Furthermore, the touch panel includes an optical type, an ultrasonic type, an electromagnetic induction type, a capacitive type and a resistive type according to a position detection system. The transparent conductive film of the invention can be used in a touch panel according to any system. Above all, the transparent conductive film of the invention is suitable for a capacitive touch panel because of inconspicuousness of the pattern shape applied to the transparent conductive layer.

Method for Producing the Transparent Conductive Film

Figure 6:
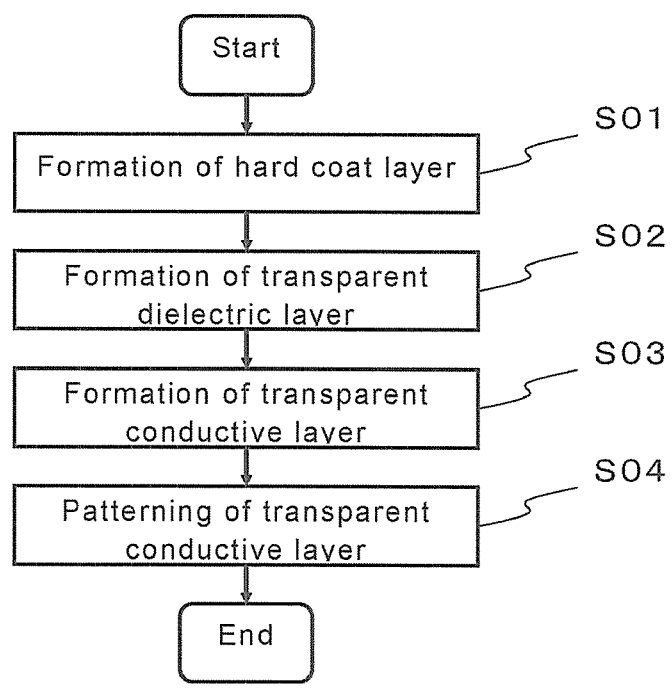
FIG. 6 is a flow chart showing steps for producing a transparent conductive film (in a case of having a transparent dielectric layer).

With reference to FIG. 6, a method for producing a transparent conductive film according to a fifth embodiment of the invention will be explained. First, a hard coat layer 12 is laminated on one face of a transparent base 11 formed of a film-like polymer resin by a wet coating method (S01). Next, a transparent dielectric layer 13 is laminated as required on a face of the hard coat layer 12 on a side opposite to the base 11 (S02). Next, a transparent conductive layer 14 is laminated on a face of the transparent dielectric layer 13 on a side opposite to the hard coat layer 12 (S03). Finally, the transparent conductive layer 14 is subjected to patterning (S04). A film having a thickness of 2 to 250 micrometers is used for the base 11. In addition, the present method for producing the film further includes a step for introducing an inorganic oxide into a hardening resin. Therefore, the hard coat layer 12 is formed of the hardening resin containing the inorganic oxide so as to have a refractive index of 1.40 to 1.90 and a film thickness of 0.5 to 6 micrometers. The transparent dielectric layer 13 is formed of an inorganic substance so as to have a refractive index of 1.30 to 1.50 and a film thickness of 10 to 50 nanometers. The transparent conductive layer 14 is formed of at least one kind selected from the group of an inorganic oxide such as zinc oxide, tin oxide, aluminum oxide, titanium oxide, indium oxide, indium tin oxide (ITO), indium zinc oxide (IZO), gallium-added zinc oxide, fluorine-added tin oxide, antimony-added tin oxide, aluminum-added zinc oxide (AZO) and silicon-added zinc oxide, a metal such as silver and copper, and carbon so as to have a film thickness of 10 nanometers to 2 micrometers. Then, the layer is subjected to patterning in a predetermined shape. In addition, according to the method for producing the layer, the hard coat layer is laminated according to the wet coating method. Therefore, the layers can be laminated at a line speed of several tens of meters per minute (about 20 meters per minute, for example), and production efficiency can be increased. Furthermore, the hard coat layer is formed of the hardening resin containing the inorganic oxide. Therefore, the refractive index of the hard coat layer can be easily adjusted by controlling a type and an amount of the inorganic oxide to be contained.

EXAMPLES

In the following, the invention will be explained in detail by way of Examples, but the invention is in no way limited to the Examples.

Measuring for Measuring Characteristics and Method for Evaluating an Effect

A method for measuring characteristics and a method for evaluating an effect in the invention are as described below.

(Total Luminous Transmittance)

Total luminous transmittance was measured using NDH-5000 made by Nippon Denshoku Industries Co., Ltd. in accordance with JIS K7361.

(Color Difference)

A color difference $\Delta E^*$ was calculated by measuring $L^*$, $a^*$ and $b^*$ values of transmitted light from a patterned part and a non-patterned part by using SD5000 made by Nippon Denshoku Industries Co., Ltd. in accordance with JIS Z8729. The color difference $\Delta E^*$ was calculated by squaring differences of $L^*$, $a^*$ and $b^*$ values, namely $\Delta L^*$, $\Delta a^*$ and $\Delta b^*$, adding the squared values, and then taking a square root thereof ($\Delta E \geq 0$). As the value of $\Delta E^*$ is smaller, the patterned part becomes less visible.

(Surface Resistance)

Surface resistance ($\Omega/\square$) of an ITO film was measured using MCP-T610 made by Mitsubishi Chemical Analytech Co., Ltd. according to a four-point probe method.

(Thickness of Each Layer)

A film thickness of a transparent plastic base 11 was measured by means of Nikon Digimicro MF-501. A thickness of other layers was measured by observing a cross-section by means of Scanning Electron Microscope SU70 made by Hitachi, Ltd.

(Refractive Index of Each Layer)

A refractive index of each layer was measured using an Abbe refractrometer made by ATAGO Co., Ltd.

(Evaluation of Visibility)

A sample of a transparent conductive film was placed on a black plate such that a side of a transparent conductive layer faces upward, and whether or not a patterned part and a non-patterned part (pattern opening) are distinguishable by visual observation was evaluated based on criteria as described below.

Good: hardly distinguishable between the patterned part and the non-patterned part (pattern opening).

Marginal: slightly distinguishable between the patterned part and the non-patterned part (pattern opening).

Bad: clearly distinguishable between the patterned part and the non-patterned part (pattern opening).

x: clearly distinguishable between the patterned part and the non-patterned part (pattern opening).

Preparation of a Hard Coat Layer-Coating Liquid (Preparation of a Hard Coat Layer-Coating Liquid (a1))

A hard coat layer-coating liquid (a1) was prepared by mixing 100 parts by weight of acrylic ultraviolet curing resin (Unidic 17-824-9: made by DIC, Inc.), 63 parts by weight of colloidal zirconia (NanoUse OZ-S30K: made by Nissan Chemical Industries, Ltd.) and 460 parts by weight of methyl isobutyl ketone.

(Preparation of a Hard Coat Layer-Coating Liquid (a2))

A hard coat layer-coating liquid (a2) was prepared by mixing 100 parts by weight of acrylic ultraviolet curing resin (Unidic 17-824-9: made by DIC, Inc.), 150 parts by weight of colloidal zirconia (NanoUse OZ-S30K: made by Nissan Chemical Industries, Ltd.) and 420 parts by weight of methyl isobutyl ketone.

(Preparation of Hard Coat Layer-Coating Liquid (a3))

A hard coat layer-coating liquid (a3) was prepared by mixing 100 parts by weight of acrylic ultraviolet curing resin (Unidic 17-824-9: made by DIC, Inc.) and 150 parts by weight of methyl isobutyl ketone. The coating liquid (a3) contains no colloidal zirconia.

Example 1

(Formation of a Hard Coat Layer (A1))

A hard coat layer-coating liquid (a1) was applied to one face of a transparent plastic base formed of a polyethylene terephthalate film (hereinafter, referred to as a PET film) having a film thickness of 125 micrometers such that a film thickness may be 0.8 micrometer after UV hardening. After UV hardening, a hard coat layer (A1) was formed.

(Formation of a Hard Coat Layer (B1))

The hard coat layer-coating liquid (a1) was applied with a bar coater to a face of the PET film on which the hard coat layer (A1) was formed on a side opposite to a face on which the hard coat layer (A1) was formed such that a film thickness becomes 1.2 micrometers after UV hardening. The hard coat layer (B1) was formed hereinafter in a manner similar to formation of the hard coat layer (A1).

Example 2

(Formation of a Hard Coat Layer (A2))

A hard coat layer (A2) was formed by performing an operation in a manner similar to formation of the hard coat layer (A1) in Example 1 except that the hard coat layer-coating liquid (a1) was changed to a hard coat layer-coating liquid (a2). A film thickness of the hard coat layer (A2) was 0.9 micrometer.

(Formation of a Hard Coat Layer (B2))

A hard coat layer (B2) was formed by performing an operation in a manner similar to formation of the hard coat layer (B1) in Example 1 except that the hard coat layer-coating liquid (a1) was changed to the hard coat layer-coating liquid (a2). A film thickness of the hard coat layer (B2) was 1.4 micrometers.

Example 3

(Formation of a Hard Coat Layer (A3))

A hard coat layer (A3) was formed by performing an operation in a manner similar to formation of the hard coat layer (A1) in Example 1 except that the acrylic ultraviolet curing resin used in the hard coat layer-coating liquid (a1) was changed to an acrylate ultraviolet curing resin (Peltron XJC-0563-FL; made by Pelnox Limited). A film thickness of the hard coat layer (A3) was 0.8 micrometer.

(Formation of a Hard Coat Layer (B3))

A hard coat layer (B3) was formed by performing an operation in a manner similar to formation of the hard coat layer (B1) in Example 1 except that the acrylic ultraviolet curing resin used in the hard coat layer-coating liquid (a1) was changed to the acrylate ultraviolet curing resin (Peltron XJC-0563-FL; made by Pelnox Limited). A film thickness of the hard coat layer (B3) was 1.3 micrometers.

Example 4

(Formation of a Hard Coat Layer (A4))

A hard coat layer (A4) was formed by performing an operation in a manner similar to formation of the hard coat layer (A1) in Example 1 except that the acrylic ultraviolet curing resin used in the hard coat layer-coating liquid (a1) was changed to an acrylate ultraviolet curing resin (LIODURAS TYT80-01: made by Toyo Ink Mfg Co., Ltd.). A film thickness of the hard coat layer (A4) was 0.8 micrometer.

(Formation of a Hard Coat Layer (B4))

A hard coat layer (B4) was formed by performing an operation in a manner similar to formation of the hard coat layer (B1) in Example 1 except that the acrylic ultraviolet curing resin used in the hard coat layer-coating liquid (a1) was changed to the acrylate ultraviolet curing resin (LIODURAS TYT80-01: made by Toyo Ink Mfg Co., Ltd.). A film thickness of the hard coat layer (B4) was 1.5 micrometers.

Comparative Example 1

(Formation of a Hard Coat Layer (B5))

A hard coat layer (B5) was formed by performing an operation in a similar manner in Example 1 except that the hard coat layer (A1) was not arranged. A film thickness of the hard coat layer (B5) was 1.5 micrometers.

Comparative Example 2

(Formation of a Hard Coat Layer (A6))

A hard coat layer (A6) was formed by performing an operation in a manner similar to formation of the hard coat layer (A1) in Example 1 except that the hard coat layer-coating liquid (a1) was changed to a hard coat layer-coating liquid (a3). A film thickness of the hard coat layer (A6) was 0.8 micrometer.

(Formation of a Hard Coat Layer (B6))

A hard coat layer (B6) was formed by performing an operation in a manner similar to formation of the hard coat layer (B1) in Example 1 except that the hard coat layer-coating liquid (a1) was changed to the hard coat layer-coating liquid (a3). A film thickness of the hard coat layer (B6) was 1.3 micrometers.

Common to Examples 1 to 4 and Comparative Examples 1 to 2

(Formation of a SiO$_2$/Transparent Dielectric Layer)

Transparent dielectric layers in Examples 1 to 4 and Comparative Examples 1 to 2 were formed on the hard coat layers (A1) to (A6) by using a Si target material under an atmosphere of a mixed gas of argon and oxygen according to a reactive sputtering method. A SiO$_2$ thin film having a thickness of 30 nanometers and a refractive index of 1.45 was obtained.

(Formation of ITO/Transparent Conductive Layer)

Subsequently, a transparent conductive layer was formed on the transparent dielectric layer by using a target including 98% by mass of indium oxide and 2% by mass of tin oxide according to a sputtering method. An ITO film having a thickness of 30 nanometers was obtained. Subsequently, a photoresist film subjected to predetermined patterning was formed on the ITO film, and then the resulting assembly was immersed into a solution of hydrochloric acid to etch the ITO film, and thus a pattern was formed. After completion of patterning of the ITO film, the ITO film was subjected to heat treatment under condition of 150° C. and 90 minutes to crystallize an ITO film part, and thus transparent conductive films according to Examples 1 to 4 and Comparative Examples 1 to 2 were obtained.

FIG. 7 shows a layer constitution of the ITO transparent conductive film according to Examples 1 to 4 and Comparative Examples 1 to 2. Table 1 shows experimental results for the ITO transparent conductive films according to Examples 1 to 4 and Comparative Examples 1 to 2.

TABLE 1

|  | Example 1 | Example 2 | Example 3 | Example 4 | Comparative Example 1 | Comparative Example 2 |
|---|---|---|---|---|---|---|
| Refractive index |  |  |  |  |  |  |
| Hard coat layer (A1 to 6) | 1.58 | 1.62 | 1.65 | 1.80 | — | 1.52 |
| Hard coat layer (B1 to 6) | 1.58 | 1.62 | 1.65 | 1.80 | 1.58 | 1.52 |
| Surface resistance (Ω/□) | 270 | 280 | 280 | 290 | 270 | 270 |
| Total luminous transmittance (%) |  |  |  |  |  |  |
| Patterned part | 88.6 | 88.9 | 88.5 | 88.3 | 88.9 | 88.2 |
| Non-patterned part | 90.7 | 90.1 | 91.2 | 89.1 | 90.1 | 90.2 |
| Color difference (ΔE* value) | 2.89 | 2.61 | 2.42 | 1.39 | 3.86 | 4.27 |
| Visibility | Good | Good | Good | Good | Marginal | Bad |

Example 5 and Comparative Example 3

In Example 5 and Comparative Example 3, a film had no transparent dielectric layer ($SiO_2$), and a transparent conductive layer was formed of silver in a manner similar to Example 4 and Comparative Example 2.

(Formation of a Silver/Transparent Conductive Layer)

A coating liquid containing silver nanoparticles (Silver Nanoparticle Ink, made by Sigma-Aldrich Japan K. K.) was applied with a bar coater to the hard coat layers (A4) and (A6) in Example 4 and Comparative Example 2, respectively. The resultant coating film was dried at 120° C. for 60 seconds, and thus a transparent conductive layer was formed.

FIG. 7 shows a layer constitution of the silver transparent conductive film according to Example 5 and Comparative Example 3. Moreover, Table 2 shows experimental results (refractive index) of the silver transparent conductive film according to Example 5 and Comparative Example 3.

Example 6 and Comparative Example 4

In Example 6 and Comparative Example 4, a film has no transparent dielectric layer ($SiO_2$), and a transparent conductive layer was formed of carbon in a manner similar to Example 4 and Comparative Example 2.

(Formation of a Carbon/Transparent Conductive Layer)

A coating liquid containing carbon nanoparticles (EP TDL-2MIBK, made by Mitsubishi Materials Electronic Chemicals Co., Ltd.) was applied with a bar coater to the hard coat layers (A4) and (A6) in Example 4 and Comparative Example 2, respectively. The resultant coating film was dried at 120° C. for 60 seconds, and thus a transparent conductive layer was formed.

FIG. 7 shows a layer constitution of the silver transparent conductive film according to Example 6 and Comparative Example 4. Moreover, Table 3 shows experimental results (refractive index) of the carbon transparent conductive film according to Example 6 and Comparative Example 4.

TABLE 2

|  | Hard coat layer (A) | Hard coat layer (B) | Visibility |
|---|---|---|---|
| Example 5 | 1.80 | 1.80 | Good |
| Comparative Example 3 | 1.52 | 1.52 | Bad |

TABLE 3

|  | Hard coat layer (A) | Hard coat layer (B) | Visibility |
|---|---|---|---|
| Example 6 | 1.80 | 1.80 | Good |
| Comparative Example 4 | 1.52 | 1.52 | Bad |

As shown in Table 1, even when the transparent conductive layer was subjected to patterning, the transparent conductive films satisfying the range of the invention according to Examples 1 to 4 had no emphasized difference between the patterned part and the non-patterned part. Therefore, the transparent conductive film of the invention had an excellent visibility upon being arranged on a front face of a touch panel or the like, and thus used. On the other hand, the transparent conductive film having an unsuitable layer constitution (Comparative Example 1), or the transparent conductive film having the hard coat layer containing no inorganic oxide (Comparative Example 2) had a poor visibility because the patterned part was visible.

As described above, the transparent conductive film of the invention has the constitution in which the hard coat layer, the transparent dielectric layer and the transparent conductive layer are laminated in the order, and the film thickness and the refractive index of each layer are controlled, individually. Therefore, when the transparent conductive layer is subjected to patterning, the difference of the optical characteristics can be significantly reduced between the patterned part (part having the transparent conductive layer) and the non-patterned part (pattern opening part from which the transparent conductive layer is removed). Therefore, even if the film is used for the touch panel and arranged on the front face of a display body, the film can make the pattern of the transparent conductive layer less visible, and can make the visibility of the touch panel satisfactory. Furthermore, the hard coat layer contains the inorganic oxide. Therefore, the refractive index of the hard coat layer can be easily adjusted by controlling a type and an amount of the inorganic oxide. Furthermore, a variation of the refractive index of the hard coat layer can be increased by adjusting the type and the amount of the inorganic oxide. Therefore, more options can be created for the refractive index of the transparent dielectric layer used as an upper layer and the refractive index of the transparent conductive layer. Furthermore, when the hard coat layer is laminated on both faces of the transparent plastic base, the hard coat layer can significantly suppress curling of the transparent plastic base.

INDUSTRIAL APPLICABILITY

A transparent conductive film of the invention has a small difference in optical characteristics between a patterned part of a transparent conductive layer, and a non-patterned part thereof, and has an excellent transparency and visibility upon being arranged on a front face of a display body of a touch panel or the like. Therefore, the film is particularly suitable as the transparent conductive film for the touch panel.

Use of the terms "a," "an," "the" and similar referents used in the context in explanation of the invention (particularly in the context of claims as described below) is to be construed to cover both the singular form and the plural form, unless otherwise indicated herein or clearly contradicted by context. The terms "comprising," "having," "including" and "containing" are to be construed as open-ended terms (more specifically, meaning "including, but not limited to") unless otherwise noted. Recitation of ranges of values herein are merely intended to serve as a shorthand method of referring individually to each separate value falling within the range, unless otherwise indicated herein, and each separate value is incorporated herein as if it were individually recited herein. All methods described herein can be performed in any suitable order unless otherwise indicated herein or otherwise clearly contradicted by context. The use of any and all examples, or exemplary language ("such as") provided herein, is intended merely to better illuminate the invention and does not pose a limitation on the scope of the invention unless otherwise claimed. No language herein should be construed as indicating any non-claimed element as essential to the practice of the invention.

Preferred embodiments of the invention are described herein, including the best mode known to the present inventors for carrying out the invention. Variations of the preferred embodiments may become apparent to those skilled in the art upon reading the foregoing description. The present inventors expect skilled artisans to employ such variations as appropriate, and the present inventors intend for the invention to be practiced otherwise than as specifically described herein. Accordingly, the invention includes all modifications and equivalents of the subject matter recited in the claims appended hereto as permitted by applicable law. Moreover, any combination of the elements in all possible variations thereof is encompassed by the invention unless otherwise indicated herein or otherwise clearly contradicted by context.

What is claimed is:

1. A transparent conductive film, consisting of:
   a transparent base formed of a film-like polymer resin;
   a first hard coat layer laminated on one face of the base;
   a first transparent dielectric layer optionally laminated on a face of the first hard coat layer on a side opposite to the base; and
   a first transparent conductive layer laminated on a face of the first transparent dielectric layer on a side opposite to the first hard coat layer, wherein
   the base has a film thickness of 2 to 250 micrometers,
   the first hard coat layer is formed of a hardening resin containing an inorganic oxide, and has a refractive index of 1.40 to 1.90 and a film thickness of 0.5 to 6 micrometers, wherein the hardening resin is an ultraviolet curing resin, and the inorganic oxide comprises $Al_2O_3$, $SnO_2$, $ZrO_2$, $TiO_2$, or a composite oxide thereof to adjust the refractive index of the hard coat layer,
   the first transparent dielectric layer is formed of an inorganic substance, and has a refractive index of 1.30 to 1.50 and a film thickness of 10 to 50 nanometers, and
   the first transparent conductive layer is formed of at least one kind selected from a group of an inorganic oxide, a metal and carbon, and subjected to patterning, and has a film thickness of 10 nanometers to 2 micrometers.

2. The transparent conductive film according to claim 1, wherein
   the base is formed of at least one kind selected from a group of polyethylene terephthalate, polyethylene naphthalate, triacetyl cellulose and polycarbonate,
   the first transparent dielectric layer is formed of silicon oxide ($SiO_2$), and
   the first transparent conductive layer is formed of at least one kind selected from a group of indium tin oxide, indium zinc oxide, gallium-added zinc oxide, aluminum-added zinc oxide, silver, copper and carbon.

3. An image display apparatus, comprising:
   a touch panel having the transparent conductive film according to claim 1; and
   an image panel arranged on a side opposite to the first hard coat layer of the transparent conductive film.

4. An image display apparatus, comprising:
   a touch panel having the transparent conductive film according to claim 2; and
   an image panel arranged on a side opposite to the first hard coat layer of the transparent conductive film.

5. A method for producing a transparent conductive film, consisting of:
   a step of laminating a hard coat layer on one face of a transparent base formed of a film-like polymer resin by a wet coating method;
   step of laminating a transparent dielectric layer on a face of the hard coat layer on a side opposite to the base;
   a step of laminating a transparent conductive layer on a face of the transparent dielectric layer on a side opposite to the hard coat layer; and
   a step of patterning the transparent conductive layer, wherein
   the base has a film thickness of 2 to 250 micrometers,
   the hard coat layer is formed of a hardening resin containing an inorganic oxide, and has a refractive index of 1.40 to 1.90 and a film thickness of 0.5 to 6 micrometers, wherein the hardening resin is an ultraviolet curing resin, and the inorganic oxide comprises $Al_2O_3$, $SnO_2$, $ZrO_2$, $TiO_2$, or a composite oxide thereof to adjust the refractive index of the hard coat layer,
   the transparent dielectric layer is formed of an inorganic substance, and has a refractive index of 1.30 to 1.50 and a film thickness of 10 to 50 nanometers, and
   the transparent conductive layer is formed of an inorganic oxide, and has a film thickness of 10 nanometers to 2 micrometers.

\* \* \* \* \*